US012613283B2

(12) United States Patent
Simonis et al.

(10) Patent No.: US 12,613,283 B2
(45) Date of Patent: Apr. 28, 2026

(54) METHOD AND APPARATUS FOR OPERATING A SYSTEM FOR PROVIDING AN ELECTROCHEMICAL BATTERY MODULE FOR A DEVICE BATTERY FOR A DEVICE

(71) Applicant: Robert Bosch GmbH, Stuttgart (DE)

(72) Inventors: Christian Simonis, Leonberg (DE);
Christoph Kroener, Freiberg am
Neckar (DE)

(73) Assignee: Robert Bosch GmbH, Stuttgart (DE)

( * ) Notice: Subject to any disclaimer, the term of this
patent is extended or adjusted under 35
U.S.C. 154(b) by 480 days.

(21) Appl. No.: 17/659,424

(22) Filed: Apr. 15, 2022

(65) Prior Publication Data

US 2022/0334191 A1     Oct. 20, 2022

(30) Foreign Application Priority Data

Apr. 19, 2021    (DE) ..................... 10 2021 203 868.9

(51) Int. Cl.
*G01R 31/392*        (2019.01)
*G01R 31/367*        (2019.01)
(52) U.S. Cl.
CPC ......... *G01R 31/392* (2019.01); *G01R 31/367*
(2019.01)
(58) Field of Classification Search
CPC ............... G01R 31/392; G01R 31/367; G01R
31/3842; B60L 2240/547; B60L
2240/549; B60L 2260/44; B60L 58/10;
B60L 58/16; G06F 17/13; G06F 30/27
See application file for complete search history.

(56) References Cited

U.S. PATENT DOCUMENTS

| 10,889,191 B1 * | 1/2021 | Bolger ..................... B60L 58/16 |
| 2005/0001627 A1 * | 1/2005 | Anbuky ............... G01R 31/392 |
| | | 700/297 |
| 2010/0033132 A1 | 2/2010 | Nishi et al. |
| 2010/0036626 A1 * | 2/2010 | Kang ................... G01R 31/392 |
| | | 702/63 |

(Continued)

FOREIGN PATENT DOCUMENTS

| JP | 2004263619 A | * | 9/2004 | |
| WO | WO-2017033610 A1 | * | 3/2017 | ............. B60L 50/50 |

OTHER PUBLICATIONS

J. Li et al., "A single particle model with chemical/mechanical degradation physics for lithium ion battery State of Health (SOH) estimation", Applied Energy, 212, Jan. 8, 2018, pp. 1178-1190 (13 pages).

*Primary Examiner* — Catherine T. Rastovski
*Assistant Examiner* — Lal Ce Mang
(74) *Attorney, Agent, or Firm* — Maginot, Moore & Beck
LLP

(57)        ABSTRACT

A computer-implemented method provides an electrochemical battery model and a state of health model for a device battery. The electrochemical battery model is based on a system of differential equations, models an equilibrium state, and reports a dependence between operating parameters of the device battery and a state of charge of the device battery. The state of health model includes at least one physical aging model based on a further system of differential equations, and models the state of health depending on progressions of the operating parameters of the device battery.

5 Claims, 3 Drawing Sheets

(56) References Cited

U.S. PATENT DOCUMENTS

| | | | |
|---|---|---|---|
| 2014/0070606 A1* | 3/2014 | Gibeau ................. | B60K 35/10 |
| | | | 307/9.1 |
| 2017/0125853 A1* | 5/2017 | Song ................. | H01M 10/0525 |
| 2017/0338666 A1* | 11/2017 | Christensen ......... | G01R 31/392 |
| 2019/0033392 A1* | 1/2019 | Mitsuyama .......... | G01R 31/396 |
| 2019/0319477 A1* | 10/2019 | Manikfan ................ | H02J 7/35 |
| 2022/0163589 A1* | 5/2022 | Allam ................. | G01R 31/367 |

* cited by examiner

METHOD AND APPARATUS FOR OPERATING A SYSTEM FOR PROVIDING AN ELECTROCHEMICAL BATTERY MODULE FOR A DEVICE BATTERY FOR A DEVICE

This application claims priority under 35 U.S.C. § 119 to patent application no. DE 10 2021 203 868.9, filed on Apr. 19, 2021 in Germany, the disclosure of which is incorporated herein by reference in its entirety.

The disclosure relates to electrical devices operated autonomously of the grid and comprising device batteries, especially electrically operable motor vehicles, especially electrical vehicles or hybrid vehicles, and additionally measures for providing an electrochemical battery model depending on a state of health (SOH) of the device battery. The disclosure further relates not only to mobile device batteries but also to stationary device batteries.

BACKGROUND

Energy is supplied to electrical devices and machines, for example electrically operable motor vehicles, with the aid of device batteries or vehicle batteries. These supply electrical energy for operation of the devices.

The state of health of a device battery declines appreciably in the course of its lifetime, which has the effect of decreasing maximum storage capacity. One measure of the aging of the device battery depends on an individual load on the device battery, i.e., in the case of vehicle batteries of motor vehicles, on the driving behavior of a driver, external environmental conditions and the type of vehicle battery.

Moreover, electrochemical battery models that are frequently implemented in battery management systems report a dependence of the state of charge, the battery current, the terminal voltage and the battery temperature for an individual device battery, such that, for example, it is possible to model a state of charge based on electrochemical parameters depending on the current flow in the energy storage means or out of the energy storage means.

SUMMARY

The disclosure provides a method of providing an electrochemical battery model and a state of health model for a device battery and to an apparatus in an electrically operable device. Further configurations are specified in the dependent claims.

In a first aspect, a computer-implemented method for providing an electrochemical battery module and a state of health model for a device battery depending on a state of health of the instrument battery is provided, wherein the electrochemical battery model, based on a system of differential equations, models an equilibrium state and is designed to report any dependence between operating parameters of the device battery and a state of charge of the device battery, wherein the state of health model comprises at least one physical aging model based on a further system of differential equations, and is designed to model a state of health depending on depending on progressions of operating parameters of the device battery, comprising the following steps: using the physical aging model of the state of health model with progressions of operating parameters that characterize the operation of the device battery, in order to ascertain a state of health, with establishment of an internal state of the system of differential equations of the physical aging model; adjusting at least one model parameter of the electrochemical battery model based on operating parameters of the device battery by a calibration method; adapting at least one model parameter of the electrochemical battery model depending on the current internal state of the physical aging model and/or adapting at least one internal state of the differential equation system of the physical aging model based on a model parameter of the electrochemical battery model.

In a further aspect, a computer-implemented method of providing an electrochemical battery model for a device battery depending on the state of health of the device battery is provided, wherein the electrochemical battery model, based on a system of differential equations, models an equilibrium state and is designed to report a dependence between operating parameters of the device battery and a state of charge of the device battery, wherein a state of health model comprises at least one physical aging model based on a further system of differential equations, and is designed to model a state of health depending on depending on progressions of operating parameters of the device battery, comprising the following steps: using the physical aging model of the state of health model with progressions of operating parameters that characterize the operation of the device battery, in order to ascertain a state of health, with establishment of an internal state of the system of differential equations of the physical aging model; adapting at least one model parameter of the electrochemical battery model depending on the current internal state of the physical aging model.

In a further aspect, a computer-implemented method of providing a state of health model for a device battery depending on the state of health of the device battery is provided, wherein the electrochemical battery model), based on a system of differential equations, models an equilibrium state and is designed to report a dependence between operating parameters of the device battery and a state of charge of the device battery, wherein the state of health model comprises at least one physical aging model based on a further system of differential equations, and is designed to model a state of health depending on depending on progressions of operating parameters of the device battery, comprising at least one of the following steps: adjusting at least one model parameter of the electrochemical battery model based on operating parameters of the device battery by a calibration method; adapting at least one internal state of the system of differential equations of the physical aging model based on the at least one model parameter of the electrochemical battery model.

The state of health of a rechargeable device battery is typically not measured directly. This would require a number of sensors in the proximity of the device battery that would make the production of such a device battery costly and complex and increase the space required. Moreover, everyday test methods for determining the state of health in the devices are not yet available on the market. Therefore, the current state of health is generally ascertained in the devices with the aid of a physical aging model. This physical state of health model is inexact in particular situations and typically has model variances of up to more than 5%.

Owing to the inaccuracy of the physical aging model, this can additionally merely give the present state of health of the device battery. A prediction of the state of health that depends particularly on the manner of operation of the device battery, for example on the level and amount of charge inflow and charge outflow, and hence on user behavior and on use parameters, would lead to very inaccurate forecasts and is currently not envisaged.

The state of health (SOH) in device batteries is the key parameter for reporting a remaining battery capacity or remaining battery charge. The state of health is a measure of the aging of the device battery. In the case of a device battery or a battery module or a battery cell, the state of health may be reported as the capacity retention rate (SOH-C). The capacity retention rate SOH-C is reported as the ratio of the measured current capacity to a starting capacity of the fully charged battery. Alternatively, the state of health may be reported as the rise in internal resistance (SOH-R) based on an internal resistance at a start of the lifetime of the device battery. The relative change in internal resistance SOH-R rises with increasing aging of the battery.

There are promising approaches for providing a determination and prediction of a state of health of an individual device battery based on a state of health model, which is implemented in a data-based manner and is based on measurements in a multitude of device batteries. Such a data-based state of health model, which may be executed, for example, as a hybrid aging model, may be implemented, for example, in a central unit (cloud) and trained with the aid of operating parameters from the device batteries in a multitude of devices that are in communication with the central unit.

State of health models for ascertaining states of health for electrical batteries may comprise or include a physical aging model. The physical aging model is a mathematical model based on differential equations. The evaluation of the physical aging model of the state of health model with progressions of operating parameters, especially since the start of the lifetime of the device battery, leads to establishment of an internal state of the system of equations of the physical differential equations that corresponds to a physical internal state of the device battery. Since the physical aging model is based on physical laws, the model parameters of the physical aging model are parameters that report physical properties.

More particularly, it is possible to provide such state of health models in the form of a hybrid state of health model, i.e. a combination of a physical aging model with a data-based correction model. In a hybrid model, it is possible to ascertain a physical state of health with the aid of a parametrized physical or electrochemical aging model, and to provide the output therefrom subject to a correction value found from the data-based correction model, especially by addition or multiplication. The physical aging model is based on electrochemical model equations, which characterizes electrochemical states and models these for output of a physical state of health, both SOH-C and SOH-R.

In addition, the correction model of the hybrid data-based state of health model may be designed with a probabilistic regression model, or one based on artificial intelligence, especially a Gaussian process model, and may be trained to correct the state of health ascertained by the physical state of health model. For this purpose, there consequently exists a data-based correction model of the state of aging for correction of SOH-C and/or another one for correction of SOH-R. Possible alternatives to the Gaussian process are further supervised learning methods, such as a random forest model, AdaBoost model, a support vector machine or a Bayesian neural network.

Additionally provided is an electrochemical battery model which, based on differential equations parametrized via battery model parameters, models internal equilibrium states and provides a relationship between operating parameters of the device battery, namely a battery current, a battery voltage and a battery temperature, and a state of charge of the device battery. Such an electrochemical battery model is known per se and can be utilized, for example, for ascertaining charging curves or for ascertaining recommendations for use with regard to charging and discharging performance. The electrochemical battery model may be implemented within the device or likewise in the central unit.

The electrochemical battery model can model equilibrium states and include model parameters. The model parameters may be newly parametrized at regular intervals, especially when there are sufficient new data regarding measured charge states and battery parameters. These data can be collected for equivalent device batteries by evaluation in a central unit, and the new parameterization can be conducted therein. This leads to an adaptation of the model parameters of the electrochemical battery model. The adaptation of the at least one model parameter can by fitting the battery model to the data available, for example with the aid of a least-squares method or the like.

Such model parameters may include, for example, a scalar figure for cyclable lithium (value based on the cathode capacity), the proportion of cyclable lithium at the start of the lifetime of the battery (scalar value), a proportion by volume of the anode and the proportion by volume of the anode at the start of the lifetime of the device battery.

At least some of the model parameters depend on a state of health of the device battery. The model parameters of the electrochemical model also have a physical basis and can be expressed in relation to the internal states of the physical model of the state of health model.

For example, the internal states of the state of health model that are described by a state vector x can give a loss $x_{cLi}$ of cyclable lithium (in Ah) and a loss $x_{LAM}$ of active anode material (in %). By contrast, the physical model parameters of the electrochemical battery model include a scalar figure for the amount cLi of cyclable lithium (value based on the cathode capacity) and a proportion by volume ea of the anode of the battery.

The internal states of the physical aging model can then be converted to the values for cyclable lithium and for the proportion by volume of the anode that constitute model parameters of the electrochemical battery model, and vice versa. For example:

$$cLi = cLi(0) - k1 \cdot x_{cLi}$$

$$ea = ea(0) - k2 \cdot x_{LAM}$$

where cLi(0) and ea(0) correspond to a scalar figure for the amount cLi of cyclable lithium at the start of the lifetime and to a proportion by volume of the anode at the start of a lifetime, and k1, k2 are defined physical constants. The conversion or calibration and adjustment of further electrochemical states is possible.

In detail, for the above internal states and the model parameters in question, it is possible to determine the value for cyclable lithium based on the value for cyclable lithium at the start of the lifetime of the battery minus a value for the loss of cyclable lithium (in ampere hours), which is subject to a factor, and the proportion by volume of the anode depending on the proportion by volume of the anode at the start of the lifetime of the device battery minus a loss value for the active anode material which is subject to a factor, which likewise corresponds to an internal state of the physical differential equation of the state of health model. It is also possible to fit other model parameters depending on the internal states of the physical model of the state of health model.

Thus, on the basis of the physical aging model of the state of health model, it is possible to undertake adaptation of the model parameters of the electrochemical battery model.

Moreover, by means of the above-specified illustrative relationship, it is also possible to implement adaptation of the state of health model by adjusting the internal state in the system of differential equations of the aging model depending on adjusted model parameters of the electrochemical battery model.

More particularly, the model parameters of the electrochemical model based on the internal state of the state of health model may be adjusted at regular or predetermined junctures. This can, for example, by overwriting the value for one or more model parameters with a respective value dependent on a value of a corresponding internal state of the physical aging model which results from the evaluation of physical model with progressions of operating parameters of a device battery in question since the start of its lifetime.

Conversely, it is also possible to adapt the internal states of the aging model depending on adjusted model parameters of the electrochemical battery model, especially when the model parameters have changed owing to a calibration.

In principle, it is thus possible to achieve an amalgamation with associated calibration and adjustment of the states or model parameters.

In one embodiment, the use of the electrochemical battery model may comprise the determining of a charge state and/or the determining of stress factors. Further applications include the monitoring of electrochemical parameters that can also be used for recognition of anomalies. The specific focus here is on the derivation of an optimized charging strategy for the purpose of prolonging the lifetime of the battery. This firstly includes the updating of a charging curve that can be inferred from the electrochemical battery model in such a way that aging stress for the battery is minimized during charging. Secondly, this also includes the planning of the charging operation in respect of time, in order to minimize stress factors, such as calendar aging.

The charging curve, which shows a progression of the charging current versus a state of charge, is the result of solving an optimization problem based on the anode potential. The optimization problem is solved here in such a way that the derived charging curve is Pareto-optimal for the assessment criteria of charging time (to be minimized) and, on the other hand, lifetime (to be maximized). In the maximization of lifetime, within the optimization problem, critical battery states with associated high stress factors are avoided.

By utilization of the state of health model as aging prediction model, it is possible to forecast, for example, the size of the effect of a fully charged battery exposed to a high temperature with regard to the expected calendar aging. Taking account of the customary use of the vehicle, it is firstly possible to optimize the juncture of charging (for example prolonged holding at a low state of charge and charging to a higher state of charge only shortly before commencement of use or when battery temperature has been conditioned accordingly). As well as an optimized charging curve, this also permits model-predictive optimization of the expected lifetime of the vehicle, which incidentally also enables constant probability-based monitoring and assessment of the guaranteed performance as a constraint for the optimization problem.

It may be the case that the adapting of the at least one model parameter is conducted only when or whenever a change detected in the state of health amounts to a predetermined magnitude of change in the state of health.

It may additionally be the case that an amalgamation of the internal state and of the at least one model parameter is conducted, in order to adapt the physical aging model and the electrochemical battery model. According to whether the electrochemical battery model or the electrochemical aging model becomes a more accurate estimated model of the state of the battery device, the respectively less accurate model is adjusted. In other words, either the internal state of the aging model can be adapted or the electrochemical battery model can be adapted, or both can be adapted.

Preference is given to prior amalgamation of the internal state and the at least one corresponding model parameter to give an amalgamated parameter which is used as calibration basis or as parametrization basis. For this purpose, for example, it is possible to use maximum likelihood estimators, or alternatively control technology-based observer approaches. For instance, both for the internal state and the at least one model parameter corresponding to or assigned to the internal state, it is possible to determine uncertainty values for each that can be taken into account as weightings in the amalgamation.

For example, when a hybrid state of health model with a correction model based on a Gaussian process is used, the uncertainty of the internal state can be reported via the measurement of the correction parameter of the correction model and the confidence thereof. The uncertainty of the at least one model parameter can be derived, for example, via a residual error between the data basis for adjustment of the battery model and the fitted model curve.

The physical aging model can be newly parametrized with the aid of progressions of operating parameters of a multitude of device batteries and at particular junctures if there are new labels, for example from the field or the testbed.

The device battery may also be used for operation of a device such as a motor vehicle, a pedelec, a flying device, especially a drone, a machine tool, a consumer electronics device, such as a cellphone, an autonomous robot and/or a domestic appliance.

In a further aspect, an apparatus for performance of one of the above methods is provided.

BRIEF DESCRIPTION OF THE DRAWINGS

The embodiments are elucidated hereinafter with reference to the appended drawings. The figures show.

DETAILED DESCRIPTION

There follows a description of the method of the disclosure with reference to vehicle batteries as device batteries in a multitude of motor vehicles as equivalent "devices". In the motor vehicles, a data-based state of health model for the respective vehicle battery may be implemented in a control unit. The state of health model may be updated or retrained continuously in a central unit on the basis of progressions of operating parameters of the vehicle batteries from the vehicle fleet. Alternatively, the state of health model may be operated purely in a cloud, and the results for calculation of the state of health and of the prediction of the state of health may be provided. The state of health model is operated in the central unit and used for calculation of aging and prediction of aging. In addition, the electrochemical battery module may be utilized in the motor vehicle and/or in the central unit. The parameterization adapted to the state of health enables improved provision of a dependence of the battery voltage, the battery current, the battery temperature and the state of charge.

The above example is representative of a multitude of stationary or mobile devices supplied with energy autonomously of the grid, for example motor vehicles (electrical vehicles, pedelecs etc.), installations, machine tools, domestic appliances, IOT devices and the like, which are connected via an appropriate communications connection (e.g. LAN, Internet) to a central unit (cloud).

Figure 1:
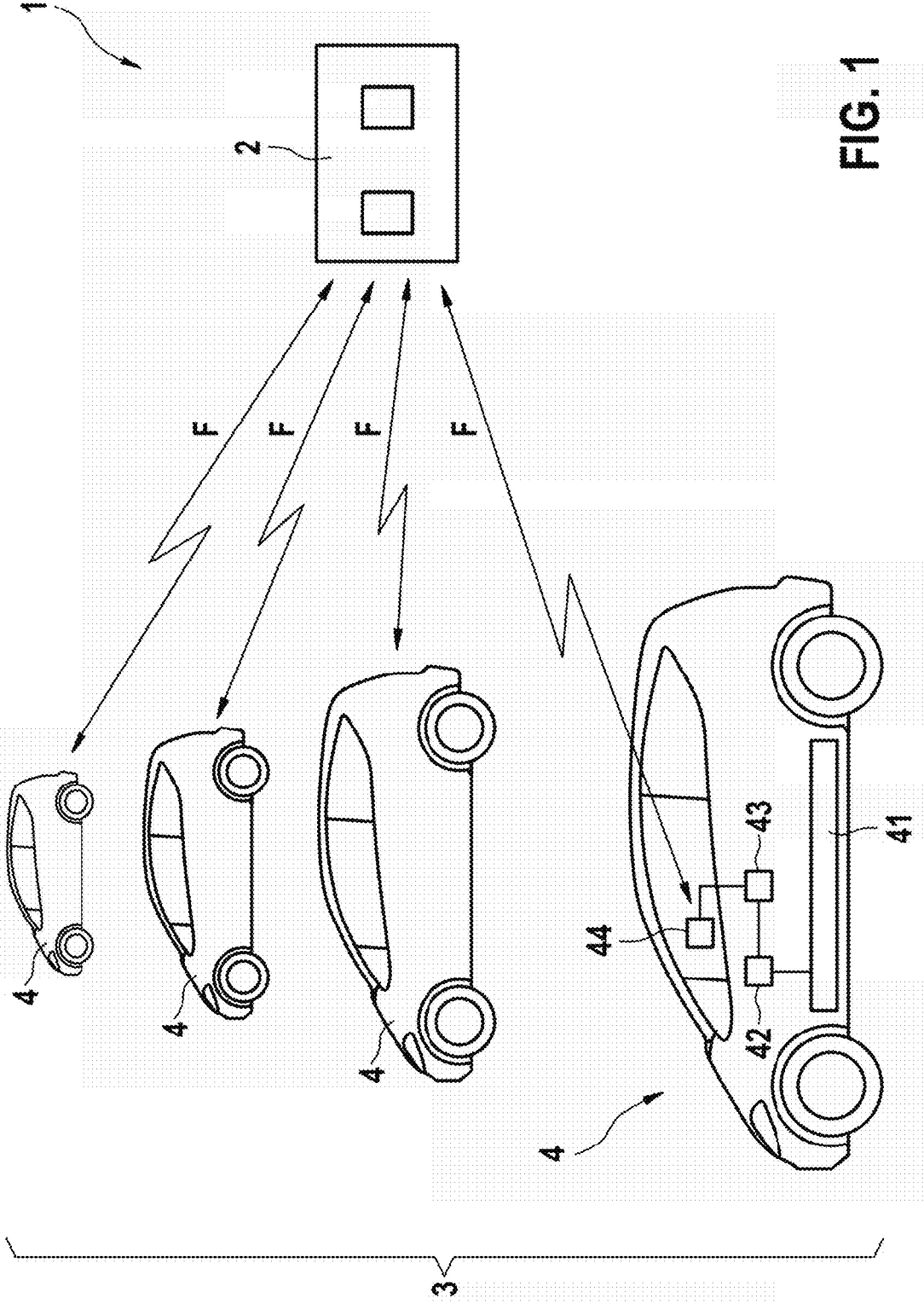
FIG. 1 a schematic diagram of a system for provision of driver- and vehicle-specific operating parameters for provision of an electrochemical battery model adapted to a state of health for a vehicle battery in a central unit.

FIG. 1 shows a system 1 for collecting fleet data in a central unit 2 for creation and operation and for evaluation of a state of health model and an electrochemical battery model.

The state of health model serves to determine a state of health of a vehicle battery in a motor vehicle. FIG. 1 shows a vehicle fleet 3 comprising multiple motor vehicles 4.

One of the motor vehicles 4 is shown in more detail in FIG. 1. The motor vehicles 4 each have a vehicle battery 41, an electrical drive motor 42 and a control unit 43. The control unit 43 is connected to a communications module 44 capable of transmitting data between the respective motor vehicle 4 and a central unit 2 (a "cloud").

The motor vehicles 4 transmit to the central unit 2 the operating parameters F that at least report parameters that affect the state of health of the vehicle battery or are influenced by the state of health of the vehicle battery. The operating parameters F, in the case of a vehicle battery, may report a present battery current I(t), a present battery voltage U(t), a present battery temperature T(t) and a present state of charge SOC(t), at the pack level, at the module level and/or at the cell level. The operating parameters F are detected in a rapid timeframe according to the signal between typically between 0.1 Hz to 100 Hz and can be transmitted regularly to the central unit 2 in uncompressed and/or compressed form. For example, the time series may be transmitted in blocks to the central unit 2 at intervals of 10 min up to several hours.

The operating parameters F, in the central unit 2 or in other embodiments, can also be used directly in the respective motor vehicles 4 to generate operating features M relating to an evaluation period. The evaluation period for the determination of the state of health may be a few hours (for example 6 hours) to several weeks (for example one month). A customary value for the evaluation period is one week.

The operating features may, for example, be features based on the evaluation period and/or features accumulated over the lifetime to date (i.e. since commencement of the lifetime) and/or statistical parameters ascertained over the entire lifetime to date. More particularly, the operating features may include, for example: histogram data versus the progression of the state of health, temperature, battery voltage, battery current, especially multidimensional histograms based on the battery temperature distribution versus the state of charge, the charging current distribution versus temperature and/or the discharging current distribution versus temperature, accumulated total charge (Ah), an average increase in capacity in a charging operation (especially for charging operations in which the increase in charge exceeds a threshold value (e.g. 20%) of the total battery capacity), an extreme value of the differential capacity during a measured charging operation with a sufficiently large amplitude in the charge state (dQ/dU: change in charge divided by change in the battery voltage) and others.

The state of health (SOH) is the key parameter for reporting of a remaining battery capacity or remaining battery charge. The state of health is a measure of the aging of the vehicle battery or a battery module or a battery cell, and can be reported as the capacity retention rate (SOH-C) or as the rise in internal resistance (SOH-R). The capacity retention rate SOH-C is reported as the ratio of the measured present capacity to an initial capacity of the fully charged battery. The relative change in internal resistance SOH-R rises with increasing aging of the battery.

A state of health model is implemented in the central unit 2, which may especially be wholly or partly data-based. The state of health model may be used regularly, i.e., for example, after the respective evaluation period has elapsed, in order to undertake ascertainment of the current state of health of the vehicle battery 41 based on the operating features and/or the operating parameters. In other words, it is possible, based on the operating parameters and/or the operating features, which result from the progressions of operating parameters of one of the motor vehicles 4 in the fleet 3, to ascertain a state of health of the relevant vehicle battery 41.

Figure 2:
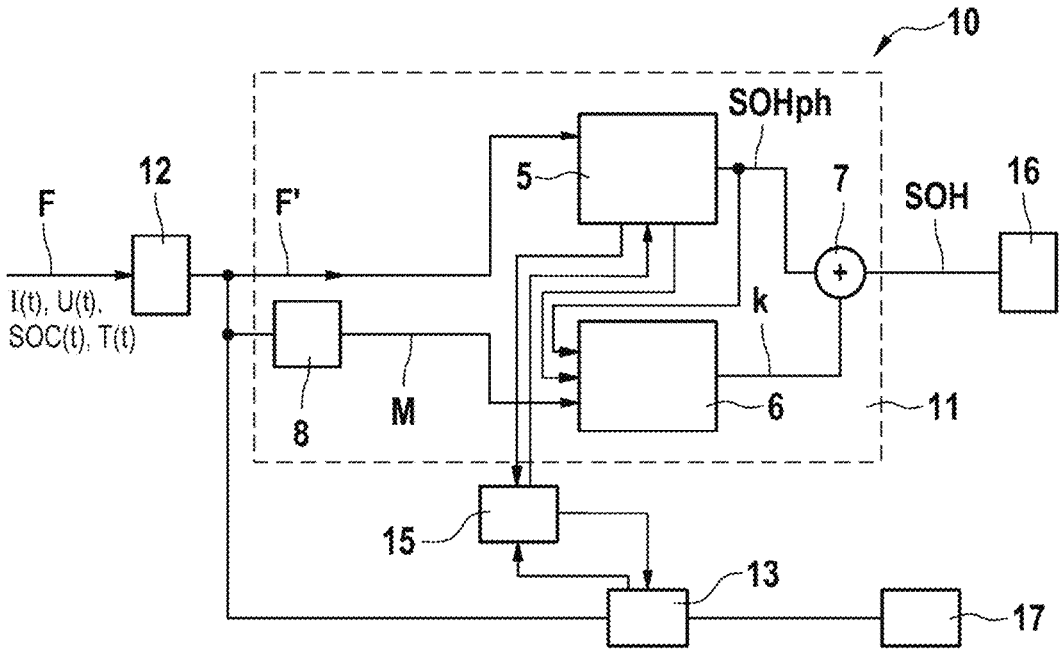
FIG. 2 a schematic block diagram of a functional construction of the functions in the central unit for implementation of a state of health model and of an electrochemical battery model.

FIG. 2 shows, by way of example, in schematic form, the functional construction of a model system 10 in one embodiment. The model system 10 comprises a state of health model 11 and an electrochemical battery model 12.

The state of health model 11 may be constructed in a hybrid manner. In the embodiment shown, the state of health model 11 comprises a physical aging model 5 and a correction model 6. These receive, in an optional data cleaning block 12, filtered operating parameters F' that can be filtered for avoidance of outliers. The operating features M of the current evaluation period are generated in a feature extraction block 8 based on the time series of the operating parameters F.

The filtered operating parameters F go directly into the physical aging model 5, which is preferably executed as an electrochemical model and describes corresponding electrochemical states, such as layer thicknesses (e.g. SEI thickness), change in cyclable lithium on account of anode/cathode side reactions, fast consumption of electrolytes, slow consumption of electrolytes, loss of active material in anode, loss of active material in cathode, etc . . . ), with the aid of nonlinear differential equations.

The physical aging model 5 corresponds to an electrochemical model of the battery cell and of the cell chemistry, which is based on differential equations. The physical aging model 9, depending on the progression of the filtered operating parameters F' since the start of the lifetime of the vehicle battery, ascertains internal physical battery states in order to a physically based state of health SOHph of the dimension of at least one in the form of the abovementioned electrochemical states that are modeled in a linear or nonlinear manner at a capacity retention rate (SOH-C) and/or a rate of rise in the internal resistance (SOH-R), in order to provide these (SOH-C and SOH-R). Model parameters of the physical aging model are assumed herein to be constant and defined. These may optionally be fitted at given junctures on the basis of labels, for example coefficients for description of the side reactions.

However, the model values provided for the physical state of health SOHph by the physical aging model 5 are inexact in particular situations, and correction of these with a correction parameter k is therefore envisaged. The correction parameter k is provided by the data-based correction model 6, which is trained with the aid of training datasets from the vehicles 4 in the vehicle fleet 3 and/or with the aid of laboratory data.

The correction model 6 receives, on the input side, operating features M that are ascertained from the progressions of the operating parameters F and may also include one or more of the internal electrochemical states of the physical model. In addition, the correction model 6, on the input side, may receive the physical state of health SOHph obtained from the physical aging model 5. The operating features M of the current evaluation period are generated in a feature extraction block 8 based on the time series of the operating parameters F.

For the determination of a corrected state of health SOH as output, the outputs SOHph, k of the physical aging model 5 and of the correction model 6, which is preferably executed as a Gaussian process model, are processed with one another. More particularly, these are added or multiplied (not shown) in a summation block 7 in order to obtain the modeled state of health SOH as output for a current evaluation period.

The physical aging model 5 and the correction model 6 are adjusted at regular time intervals based on the progressions of operating parameters and the states of health ascertained by other methods of generating labels, such as coulomb counting and the like. New parameterization of the physical aging model 5 does not take place unless new labels from laboratory data or on the basis of field diagnosis measurements (=ground truth) are available. If new labels are available, it is possible to newly parametrize the aging model, but this is only implemented rarely (for example at intervals of 6 months). However, the adjustment of the physical aging model 5 to the actual state of the battery, with essentially constant parameters of the aging model, is achieved by the variability of the internal state (state vector) of the system of differential equations.

The physical model at the current juncture thus takes on an internal state dependent on the state of health, which corresponds to physical properties of the vehicle battery 41 or of at least one module of the vehicle battery 41 or of at least one cell of the vehicle battery 41.

For an individual device battery, it is then possible, on the basis of the underlying physical aging model 5, to ascertain an internal state by evaluating the progression of the operating parameters since commencement of operation of the vehicle battery. This internal state is characterized by one or more state parameters that can be used for derivation of one or more model parameters for the electrochemical battery model.

The system of differential equations of the physical aging model 5, with the state vector x, may, for example, have a structure as follows:

$$SOHC = f(x)$$

$$\dot{x}_{cLi} = h(I(t), U(t), SOC(t), T(t), x)$$

$$\dot{x}_{LAM} = g(I(t), U(t), SOC(t), T(t), x)$$

$$x = [\ldots, x_{cLi}, x_{LAM}, \ldots]^T$$

For example, the internal states of the state of health model can report a loss $x_{cLi}$ of cyclable lithium (in Ah) and a loss $x_{LAM}$ of active anode material (in %) in the progression of the lifetime to date. The state vector x is calculated constantly by a time integration method from the gradient parameters $\dot{x}_{cLi}$, $\dot{x}_{LAM}$ The model execution in the central unit 2 is typically effected 1-8 times per month.

The model system may also include an electrochemical battery model 13 that provides a dependence between the state of charge SOC, the battery current I, the terminal voltage U and the battery temperature T. This electrochemical battery model uses model parameters that characterize the battery performance. These model parameters of the electrochemical battery model characterize physical and/or chemical relationships and may include an SEI thickness, available lithium, solution concentration and others. However, these physical model parameters are not measurable directly and are initially estimated. The model parameters are subject to aging, and so regular an adjustment to the state of health of the vehicle battery is necessary.

The battery model may have the following structure, for example:

$$SOC = SOC(0) + \int \frac{I(t)}{C(P)} dt$$

$$OCV(SOC) = OCP_{cathode}(SOC_{cathode}) - OCP_{anode}(SOC_{anode})$$

where C=C(P) an electrode capacity is determined as a function of internal model parameters that may include at least one parameter of cyclable lithium $c_{LI}$ normalized to the anode capacity, and a proportion of anode volume ea. P is a set of parameters which is fitted regularly. OCV corresponds to the open-circuit voltage of the battery depending on the state of charge SOC, and OCP to the open-circuit potential of the anode or cathode of the battery.

It is possible to fit the electrochemical battery model with the internal states of the physical aging model to the current state of health. If the electrochemical battery model is executed as a hybrid model with a data-based correction model, the fitting of the internal states of the physical aging model may be conducted only when the data-based correction model has a sufficiently low correction value and simultaneously sufficiently high confidence (i.e. a narrow confidence interval). In this case, the electrochemical battery model has maximum certainty with regard to the electrochemical states.

For example, the resultant state parameters for the internal state of the physical model may be the loss of cyclable lithium $X_{C,LI}$ (in Ah) and the loss of active anode material $X_{LAM}$ (scalar parameter).

These may be used, for example, for adjustment of the model parameters of the electrochemical battery model. As illustrative model parameter, it is possible to determine a parameter of cyclable lithium $c_{LI}$ normalized to the cathode capacity and a proportion of anode volume ea as follows:

$$cLi = cLi(0) - k1 \cdot x_{cLi}$$

$$ea = ea(0) - k2 \cdot x_{LAM}$$

where cLi(0) and ea(0) correspond to a scalar figure for the amount cLi of cyclable lithium at the start of the lifetime or a proportion by volume of the anode at the start of the lifetime of the vehicle battery 41, and k1, k2 are defined physical constants.

Alternatively, the internal state of the physical aging model 5 may also be adjusted depending on a new determination or adjustment of the model parameters of the battery model.

The adjustments of the internal state and of the model parameters may be implemented in an adaptation block 15, in each case depending on a change in the model parameters by a model adjustment undertaken or on a change in the internal state by a significant change in battery aging, for example after a change in the state of aging by a predetermined magnitude.

In addition, amalgamation of the internal state of the aging model 15 with the model parameters of the battery model 13 is also possible in the adaptation block 15, in order, for example, to determine the most likely internal state of the aging model and optimized model parameters of the battery model on the basis of the maximum likelihood method or control technology-related observation approaches.

The amalgamation takes account of the uncertainties in the determination of the internal state and the model parameters. The uncertainties may be quantified and combined in order to obtain a lower uncertainty overall in the adaptation of the aging model and the battery model.

For example, when a hybrid state of health model with a correction model based on a Gaussian process is used, the uncertainty of the internal state can be stated/quantified by the measure of the correction parameter of the correction model and the confidence thereof. The uncertainty of the at least one model parameter can be derived, for example, via a residual error between the data basis for adjustment of the model parameters of the battery model and the fitted model curve.

In a prediction block 16, based on the adapted state of health model 10, it is possible to ascertain and signal a current state of health. More particularly, by prediction of a progression of the state of health, it is possible to make a statement as to a residual lifetime of the vehicle battery 41.

In a charging strategy block 17, the electrochemical battery model 13 is utilized in order to precisely determine a current state of charge and/or to determine the stress factors. In the charging strategy block 17, it is possible to derive a charging strategy in order to obtain an optimized charging curve that minimizes stress factors for aging of the vehicle battery and hence contributes to extension of the lifetime of the vehicle battery 41. This firstly includes the updating of the charging curve, which can be derived from the electrochemical battery model in such a way as to minimize aging stress for the battery during charging. The charging curve, which shows a progression of the charging current versus a state of charge, is found by solving an optimization problem based on the anode potential. The optimization problem is solved here in such a way that the charging curve derived is Pareto-optimal for the assessment criteria of charging time (to be minimized) and, on the other hand, lifetime (to be maximized). In the maximization of lifetime within the optimization problem, critical battery states associated with high stress factors are avoided.

Figure 3:
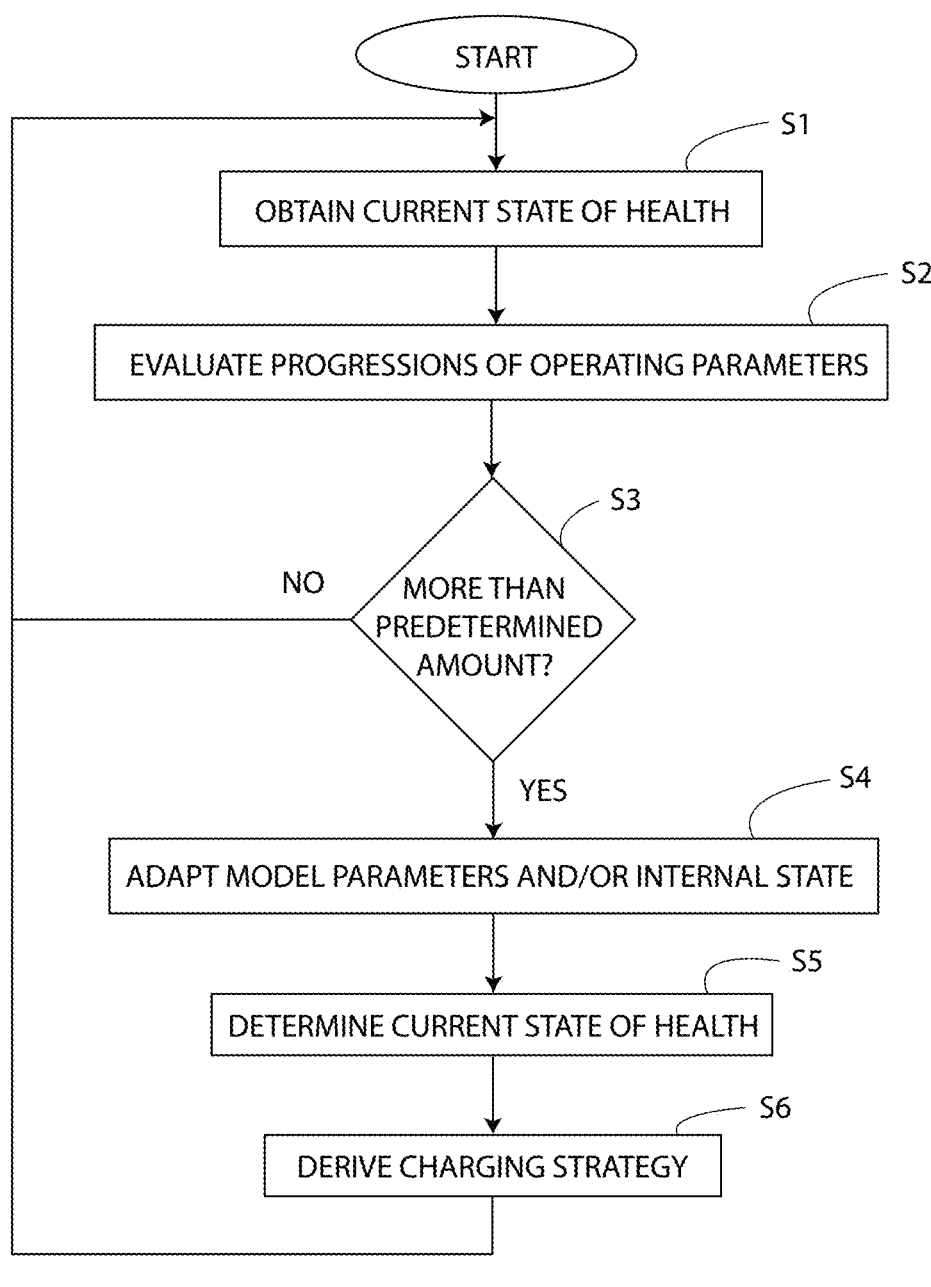
FIG. 3 a flow diagram for illustration of a method of adjusting the electrochemical battery model.

FIG. 3 shows a flow diagram for illustration of a method of adapting an electrochemical battery model for monitoring of individual device batteries.

For this purpose, in step S1, the state of health model is evaluated on the basis of progressions of operating parameters F that have been detected continuously or provided in some other way, in order to obtain a current state of health SOH.

In step S2 as well, the progressions of operating parameters are evaluated in order to provide, with the aid of the electrochemical battery model 13, dependences between the state of charge, the battery current, the terminal voltage and the battery temperature. This enables the calculating of dynamic responses of voltage with battery current, and the calculation of internal states, for example an anode overpotential, which is used to derive charging curves. The electrochemical battery model is utilized in order to ascertain charging curves, which enables a precise statement of the present state of charge based on present operating parameters. It is also possible to utilize the electrochemical battery model in order to analyze the operating performance of the device or the charging and running performance of the vehicle battery, and to derive operating recommendations.

In step S3, it is examined whether a change in the state of health by more than a predetermined change in the state of health has occurred since a last adjustment of the electrochemical battery model, for example of more than 1%, or an adjustment of the model parameters has been undertaken by evaluating the data basis in the central unit. If this is the case (alternative: yes), the method is continued with step S4; otherwise (alternative: no), the process jumps back to step S1.

In step S4, in the manner described above, the internal state and/or the model parameters are adapted depending on the internal state obtained in the aging model 5 and the present model parameters of the battery model 13.

More particularly, by an amalgamation of the internal state of the aging model and the model parameters of the battery model, for example on the basis of the maximum likelihood method or control technology-related observation approaches, it is possible to determine a most likely internal state of the aging model and a most likely parameterization of the battery model. It is also possible in each case to adapt only the internal state of the aging model 5 or the model parameters of the battery model.

In principle, the progressions of the raw data and operating parameters can be stored in a suitable manner and can be utilized for analysis, assessment and improvement of the data-based correction model when a state of health is ascertained in some other way, for example in the case of complete charging or complete discharging of the device battery, such that the total battery capacity remaining can be ascertained. By determining the ratio to the nominal battery capacity, it is possible to determine an empirical state of health SOH-C. There are also other known means of determining the state of aging, for example the SOH-R by an evaluation of dU/dI operations with the aid of an assignment function. The training data can then assign the progressions of operating parameters to an empirical state of health for an individual vehicle battery.

The physical aging model can be parametrized at regular time intervals depending on the training data, especially by parameterization with the aid of the least-squares method or the like. The parameterization of the physical state of health model can be conducted at regular time intervals, but especially when a measurement of the empirical state of health has been conducted or when the modulated state of health is a variance from the measured state of health of the last measurement of more than a given threshold, for example 1%, or when the global optimum has been attained with sufficient accuracy in numerical terms. The physical state of health of the $SOH_{PH}$ as output from the physical aging model 5 is assumed here to be the state of health of the respective training dataset.

When a hybrid state of health model is used, the data-based correction model 6 can be trained with the training data in order to ascertain a correction parameter that serves to compensate for the residual error of the physical aging model. In this way, the correction model 6 can learn the weaknesses of the physical aging model 5, in order thus to be able to undertake a correction of the physical state of health $SOH_{ph}$ in the correction block 7.

The training of the date-based correction model 6 can be conducted with cross-validation and sequential bagging (bootstrap aggregating) in order to improve robustness and accuracy.

After parameterization of the physical aging model by adjusting the model parameters of the physical model based on labels from laboratory data or on fleet data from a multitude of vehicles, it is then possible to undertake a new calculation of the actual state of health based on vehicle-specific progressions of operating parameters since commencement of operation of the vehicle battery. On the basis of the differential equations of the physical model, an internal state is established, which may comprise, for example, as described above, the loss of cyclable lithium or the loss of active anode material. After amalgamation, it is possible to ascertain the model parameters of the electrochemical battery model therefrom. These can then be updated correspondingly, such that the adjustment of the state of health model based on training data from a multitude of vehicle batteries of the same battery type can automatically also result in an improvement in the electrochemical battery model, the model parameters of which can otherwise be ascertained only in a very complex manner, especially by intrusion into the respective vehicle battery. In this way, it is possible to adapt the electrochemical battery model in a vehicle-specific manner without having to undertake complex analysis of the individual vehicle battery.

In step S5, based on the adapted state of health model 10, it is possible to ascertain and signal a current state of health. More particularly, by predicting a progression of the state of health, it is possible to make a statement as to a residual lifetime of the vehicle battery 41. For this purpose, there can be constant monitoring of the optimization of lifetime in the field. This can be updated and optimized in a model-predictive manner on the basis of the assessment of efficacy, in order, for example, to maximize the lifetime of a vehicle battery under the constraint of a sufficiently rapid charging operation.

In step S6, it is alternatively or additionally possible, based on the electrochemical battery model, especially one that has been adapted, to derive a charging strategy in order to obtain an optimized charging curve that minimizes stress factors for aging of the vehicle battery. In this case, the electrochemical battery model may also be implemented in the vehicle.

Subsequently, the method is continued with step S1.

What is claimed is:

1. A computer-implemented method for providing an electrochemical battery model and a state of health model for a device battery, the method comprising:

providing a physical aging model, included in the state of health model, with a model input including progressions of operating parameters characterizing an operation of the device battery;

outputting from the physical aging model to an adaptation block, a state of health of the device battery based on the provided model input;

establishing an internal state of a system of differential equations of the physical aging model corresponding to a physical internal state of the device battery based on the provided model input;

providing the electrochemical battery model with the model input;

outputting from the electrochemical battery model to the adaptation block (i) a state of charge of the device battery based on the model input, (ii) stress factors for the device battery based on the model input, and (iii) a charge strategy comprising an optimized charge curve based on the model input;

establishing another system of differential equations of the electrochemical battery model corresponding to an internal equilibrium state of the device battery;

determining using the adaptation block (i) when a change in the outputted state of health is greater than a predetermined change amount, and (ii) when the change in the outputted state of health is less than the predetermined change amount;

when the change in the outputted state of health is less than the predetermined change amount, operating the device battery based on at least one of (i) the outputted state of health, (ii) the outputted state of charge, (iii) the outputted stress factors, and (iv) the outputted charge strategy;

when the change in the outputted state of health is greater than the predetermined change amount (i) updating the electrochemical battery model by adapting at least one model parameter of the electrochemical battery model depending on the established internal state of the system of differential equations of the physical aging model using the adaptation block, and (ii) updating the physical aging model by adapting the established internal state of the system of differential equations of the physical aging model based on the at least one model parameter of the electrochemical battery model using the adaptation block;

outputting from the updated physical aging model an updated state of health of the device battery based on the provided model input;

outputting from the updated electrochemical battery model (i) an updated state of charge of the device battery, (ii) updated stress factors for the device battery, and (iii) an updated charge strategy comprising an updated optimized charge curve;

using the device battery based on the output of the updated electrochemical battery model and/or the output of the updated physical aging model for supplying electrical energy to a device such as a motor vehicle, a pedelec, a flying device including a drone, a machine tool, a consumer electronics device including a cellphone, an autonomous robot, or a domestic appliance; and charging the device battery based on the updated charge strategy, wherein, in order to prolong a lifetime of the device battery, the updated charge strategy minimizes the stress factors for the device battery.

2. The method according to claim 1, wherein the established internal state of the system of differential equations of the physical aging model corresponds to a loss of cyclable lithium of the device battery or a loss of active anode material of an anode of the device battery.

3. The method according to claim 1, wherein the at least one model parameter of the electrochemical battery model comprises a parameter of cyclable lithium standardized to a cathode capacity of a cathode of the device battery or a proportion of an anode volume of an anode of the device battery.

4. The method according to claim 1, wherein the adapting the at least one model parameter of the electrochemical battery model and/or the adapting the established internal state of the system of differential equations of the physical aging model using the adaptation block includes amalgamating the established internal state and the at least one adapted model parameter of the electrochemical battery model using a maximum likelihood estimator.

5. The method according to claim 1, wherein the at least one model parameter of the electrochemical battery model characterizes physical and/or chemical relationships of the device battery that are not measurable directly.

* * * * *